United States Patent [19]
Iwakiri

[11] Patent Number: 5,805,514
[45] Date of Patent: Sep. 8, 1998

[54] METHOD FOR TESTING A SEMICONDUCTOR MEMORY DEVICE AND A SEMICONDUCTOR MEMORY DEVICE

[75] Inventor: Itsuro Iwakiri, Miyazaki, Japan

[73] Assignee: Oki Electric Industry Co., Ltd., Tokyo, Japan

[21] Appl. No.: 796,388

[22] Filed: Feb. 4, 1997

[30] Foreign Application Priority Data

Sep. 3, 1996 [JP] Japan .................................. 8-232851

[51] Int. Cl.⁶ ...................................................... G11C 7/00
[52] U.S. Cl. ........................... 365/201; 365/194; 365/233
[58] Field of Search ................................... 365/201, 233, 365/194

[56] References Cited

U.S. PATENT DOCUMENTS

| | | | |
|---|---|---|---|
| 5,181,205 | 1/1993 | Kertis | 327/21.1 |
| 5,519,659 | 5/1996 | Tanida et al. | 365/201 |
| 5,625,597 | 4/1997 | Hirose | 365/201 |
| 5,640,354 | 6/1997 | Jang et al. | 365/201 |
| 5,640,509 | 6/1997 | Balmer et al. | 395/183.18 |

*Primary Examiner*—David C. Nelms
*Assistant Examiner*—Hoai V. Hu
*Attorney, Agent, or Firm*—Spencer & Frank

[57] ABSTRACT

A method and apparatus for performing a specified test on a semiconductor memory device having a clock generating circuit and a control circuit in which the clock generating circuit generates a clock signal in response to an operation request signal and the control circuit generates a reset signal for stopping generation of the clock signal after a predetermined period of time. The control circuit also generates at least one operation control signal for performing a fundamental operation of the memory device in response to the clock signal. The test is performed by inputting a test mode signal to the semiconductor memory device to initiate the specified test, delaying generation of the reset signal for a period of time exceeding the predetermined period of time, carrying out the specified test while the test mode signal is being input, and terminating the specified test by stopping input of the test mode signal. A fundamental operation is performed over a relatively long period of time (a long cycle) in a semiconductor memory device of the type which generates an internal clock signal. Since a failure which appears only in a long cycle operation can be detected, a test for a short circuit between a bit line and a cell plate can be performed.

18 Claims, 14 Drawing Sheets

METHOD FOR TESTING A SEMICONDUCTOR MEMORY DEVICE AND A SEMICONDUCTOR MEMORY DEVICE

BACKGROUND OF THE INVENTION

1. Field of the Invention

The present invention relates to a method for testing a semiconductor memory device provided with an operating clock which generates a clock signal, and to a semiconductor memory device having a novel structure. The semiconductor memory device may be a line memory, a field memory or the like. The memory device performs a fundamental operation according to the clock signal, and is automatically reset when the operation has ended. The term "fundamental operation" is defined herein as any operation normally performed by a memory device such as reading and/or writing data, refreshing data, or the like.

2. Description of the Related Art

In the operation of a DRAM, which is one type of semiconductor memory device, a voltage having a level of Vcc/2 is often applied to a cell plate of each memory cell, it being assumed that the power source voltage is Vcc. The reason for applying this voltage to the cell plate is that a change in the voltage of the cell plate can be reduced to one-half of the change in the voltage of the power source, and the same margin can be obtained when logic levels "H" and "L" are written into the memory cell. The Vcc/2 voltage is generated inside the DRAM.

In a DRAM, a current path of high resistance (hereinafter referred to as a high resistance short circuit, or for simplicity, a short circuit) caused by a patterning residual or the like often occurs between a bit line and a cell plate or between a word line and a cell plate. The reason this occurs is that these parts of the DRAM are processed with strict accuracy close to the processing limit of microlithography. Since the short circuit is of high resistance, it seldom influences the fundamental operations of the device. However, such a short circuited state often causes breakage of insulating films within the DRAM over a long period of time and, as a result, the reliability of the semiconductor memory device may deteriorate. Accordingly, the short-circuited state is sometimes detected by monitoring the voltage level of the circuit generating the Vcc/2 voltage at a terminal provided on the DRAM.

There are two methods of monitoring the level of the Vcc/2 terminal. In the first method, the level is monitored by keeping the DRAM in a standby state, and in the second method the level is monitored by keeping the DRAM in an active state. The first method can be used to detect a short circuit between a word line and a cell plate, but cannot be used to detect a short circuit between a bit line and a cell plate. The reason is that, since the word line is set at the ground level when keeping the DRAM in a standby state, if the word line and the cell plate have a high resistance short-circuit, the level of the Vcc/2 terminal is changed under the influence of a change in the level of the word line. Thus, the short circuit can be detected. On the other hand, the level of the bit line is generally set at Vcc/2 when the DRAM is kept in a standby state, that is, the bit line is set at the same level as the cell plates In this case, since the level of the Vcc/2 terminal is not changed even if the bit line and the cell plate are short-circuited, the high resistance short circuit cannot be detected.

Thus, whether or not a bit line and a cell plate are short-circuited is detected by keeping the DRAM in an active state. That is, the second method is adopted in which, by setting a sense amplifier of the DRAM to an enable state (an active state), the bit line is set at either the "H" or "L" logic level, and the level of the Vcc/2 terminal is monitored in either of these states. The reason is that, using the second method, the level of the cell plate can be monitored in a state where the bit line and the cell plate have different levels.

However, when the DRAM is monitored in this way, it is necessary to monitor the level of a specified part of the DRAM in a state where the operating time for a fundamental operation thereof is extended for a period of time which is longer than the operating time for a fundamental operation in ordinary use. The reason is that, since a high resistance short circuit is formed between the cell plate and the bit line, as described above, it takes a relatively long time for the level of the cell plate to be influenced by the "H" or "L" level of the bit line, and it is therefore necessary to keep the bit line at the "H" or "L" level for a period of time that is relatively long compared to that required for the usual fundamental operation. Such a long time test is also referred to as "a long cycle test".

This is specifically described with reference to FIG. 11 of the drawings. FIG. 11 shows the change in the level of the Vcc/2 terminal with elapsed time, where the elapsed time from the time "O" when the sense amplifier is put into an active state is represented by the axis of abscissas and the voltage level is represented by the axis of ordinates. In FIG. 11, I is a characteristic curve for the case in which the bit line is set at the Vcc level, and II is a characteristic curve for the case in which the bit line is set at the ground level. As shown by FIG. 11, if a high resistance short circuit exists between the cell plate and the bit line, even when the sense amplifier is put into an active state and the bit line is set at either the "H" or "L" level, it takes a relatively long time for the level of the Vcc/2 terminal (the VCP level in FIG. 11) to change to a level where the short-circuited state can be detected. In particular, assuming that the time required to return the sense amplifier to an inactive state in the ordinary use of the DRAM is T1, if the sense amplifier is not kept in an active state at least until a time T2 (which is much later than T1), an abnormal state such as a high resistance short circuit would not appear on the VCP level. Therefore, the short-circuited state cannot be detected without using a clock signal of lower frequency than the clock signal ordinarily used with the DRAM when carrying out this method.

However, the long cycle test cannot be applied to a semiconductor memory device of the type which generates a clock signal within the memory device, for example, a serial-access memory such as an existing field memory, line memory or the like. The reason is that in a semiconductor memory device of this existing type, the operating cycle of the clock signal is determined by a clock generating circuit built inside the device, and this clock signal is used as a frequency for ordinary fundamental operations. Furthermore, the clock signal cannot be controlled from outside the semiconductor memory device. In the present state, therefore, it has been impossible to detect a short circuit, for example, between a bit line and a cell plate in a semiconductor memory device of the type which generates a clock signal inside the memory device.

This is described in more detail with reference to FIGS. 12 to 14. FIG. 12 is a block diagram showing circuits peripheral to a clock generating circuit 13 provided within a semiconductor memory device of the type which generates a clock signal CK within the memory device. FIG. 13 is a block diagram showing sense amplifiers, memory cells, bit lines, and word lines peripheral to a memory cell group of the memory device. FIG. 14 is a timing chart for explaining the operation of the memory device.

In an existing field memory, line memory, or the like, various operation request signals Sx are inputted into an arbiter 11. The arbiter 11 establishes a priority for each of the operations and outputs an operation request signal S1 corresponding to its priority to the clock generating circuit 13. In response to the operation request signal S1, the clock generating circuit 13 generates a clock signal CK, as shown in FIG. 14. The clock signal CK is inputted into an ROW-system control circuit or control circuit 15. The ROW-system control circuit 15 controls (activates and inactivates) word lines, an ROW address counter and sense amplifiers. It also generates various driving signals according to the clock signal CK and outputs these signals to corresponding parts of the memory device.

The memory device performs fundamental operations according to the driving signals. The various driving signals include a word line driving signal S2 and a sense amplifier driving signal S3, as shown in FIG. 14. As shown in FIG. 13, the word line driving signal S2 is inputted into an X decoder 21 which drives a word line in accordance with the timing of the word line driving signal S2. The sense amplifier driving signal S3 is inputted into a sense amplifier 23 which is thereby driven to an active state. In FIG. 13, B and C represent, respectively, a bit line and a cell plate.

At a specified time after completing a sequence of processes from a word line activating operation to a sense operation, the ROW-system control circuit 15 outputs a reset signal S4 to the clock generating circuit 13 to reset it. When the clock generating circuit 13 has been reset, the ROW-system control circuit 15 is reset, as shown in FIG. 14. Since, in an existing field memory or line memory, timing for the activation of a word line, sense amplifier and the like is carried out by means of signals generated within the semiconductor memory device, the time during which a sense amplifier or a word line is kept in an active state cannot be controlled from outside the memory device. Therefore, it has not been possible to carry out the long cycle test.

Accordingly, it is an object of the present invention to provide a method for performing a long cycle test in a semi-conductor memory device of the type which generates a clock signal within the memory device, and to develop a semi-conductor memory device having a new structure suitable for carrying out the method.

SUMMARY OF THE INVENTION

The present invention comprises a method and apparatus for performing a specified test on a semiconductor memory device having a clock generating circuit and a control circuit. The clock generating circuit generates a clock signal in response to an operation request signal and the control circuit generates a reset signal for stopping generation of the clock signal after a predetermined period of time. The control circuit generates at least one operation control signal for performing a fundamental operation of the memory device in response to the clock signal.

The test is performed by inputting a test mode signal to the semiconductor memory device to initiate the specified test, delaying generation of the reset signal for a period of time exceeding the predetermined period of time, carrying out the specified test while the test mode signal is being input, and terminating the specified test by stopping input of the test mode signal.

In this way, a fundamental operation is performed over a relatively long period of time (a long cycle) in a semiconductor memory device of the type which generates a clock signal internally. Since a failure which appears only during a long cycle operation can be detected, a test for a short circuit between a bit line and a cell plate can be performed.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1:
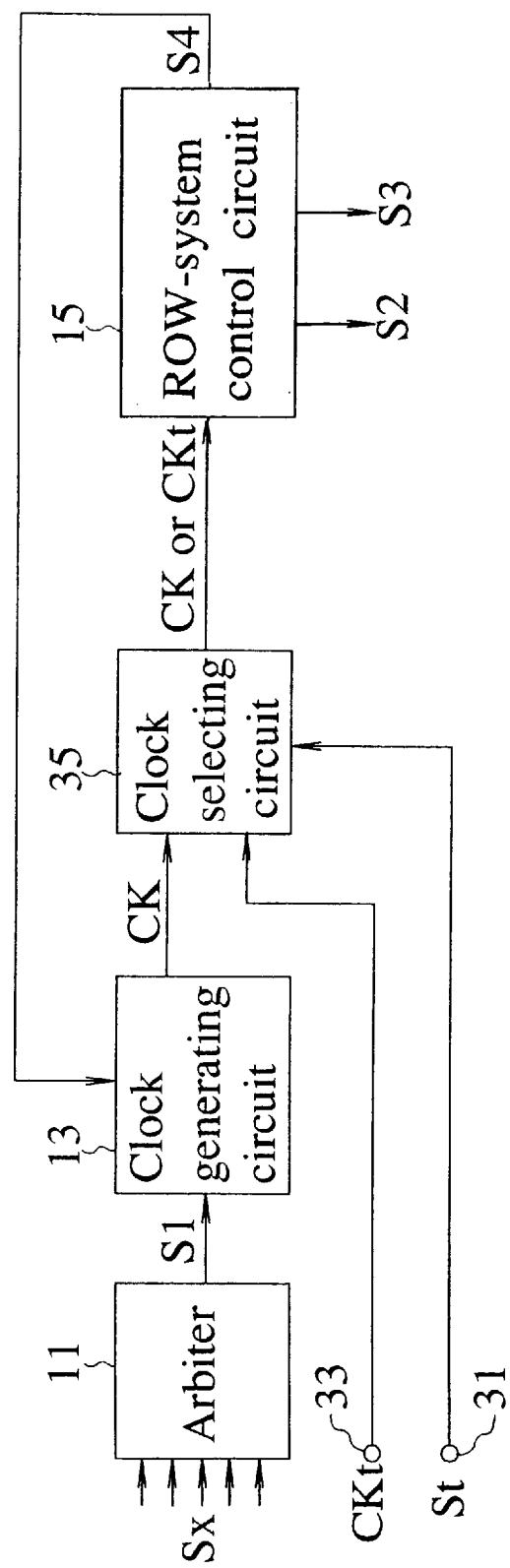
FIG. 1 is a block diagram showing a first embodiment of a semiconductor memory device of the invention.

Several embodiments of a method for testing a semiconductor memory device and of a semiconductor memory device suitable for such testing according to the present invention are described hereinafter with reference to the drawings. The same numbers have been given to similar components in the drawing figures.

First Embodiment

FIG. 1 is a block diagram showing a first embodiment of the invention. A semiconductor memory device is provided which comprises an arbiter 11 for preferentially outputting an operation request signal S1 selected from various operation request signals Sx received as inputs to the arbiter, a clock generating circuit 13 for outputting a clock signal CK when signal S1 is received, and an ROW-system control circuit 15, or control circuit, for outputting at least operation signals S2 and S3 for driving a word line and a sense amplifier respectively upon receipt of the clock signal CK. A reset signal S4 is also generated by the ROW-system control circuit 15 which is connected to the clock generating circuit 13.

The semiconductor memory device is further provided with a first terminal 31, a second terminal 33, and a clock selecting circuit 35. The first terminal 31 inputs to the clock selecting circuit 35 an externally generated test mode signal St from outside of the semiconductor memory device when a specified test is to be performed. The second terminal 33 inputs to the clock selecting circuit 35 an externally generated test clock signal CKt from outside of the semiconductor memory device when a specified test is to be performed. The test mode signal and test clock signal are signals which extends the operating time of a fundamental operation, in contrast with the operating time of the fundamental operation in ordinary use of a semiconductor memory device. Thus, if it is desired to determine if an abnormal state exists within the semiconductor memory device, the operating time of the fundamental operation may be extended by inputting the test signals.

Considering the example discussed in connection with FIG. 11, an ordinary clock signal is a clock signal which can bring a sense amplifier from an active state into an inactive state at the time T1. In contrast, the test clock signal CKt is a signal which can bring the sense amplifier from an active state to an inactive state on or after the time T2. The test clock signal CKt replaces the ordinary internal clock signal CK at the time of the test.

The test clock signal CKt can be, for example, a clock signal having a lower frequency than the clock signal CK. The optimum frequency of the test clock signal can be determined by considering the items to be tested such as the resistance of the short circuit to be detected.

The clock selecting circuit 35 supplies to the ROW-system control circuit 15 the test clock signal CKt instead of the clock signal CK from the clock generating circuit 13 when the test mode signal St has been inputted into the clock selecting circuit 35. The clock selecting circuit 35 supplies to the ROW-system control circuit 15 the clock signal CK generated by the clock generating circuit 13 when the test mode signal St is not inputted into the clock selecting circuit 35.

Figure 7:
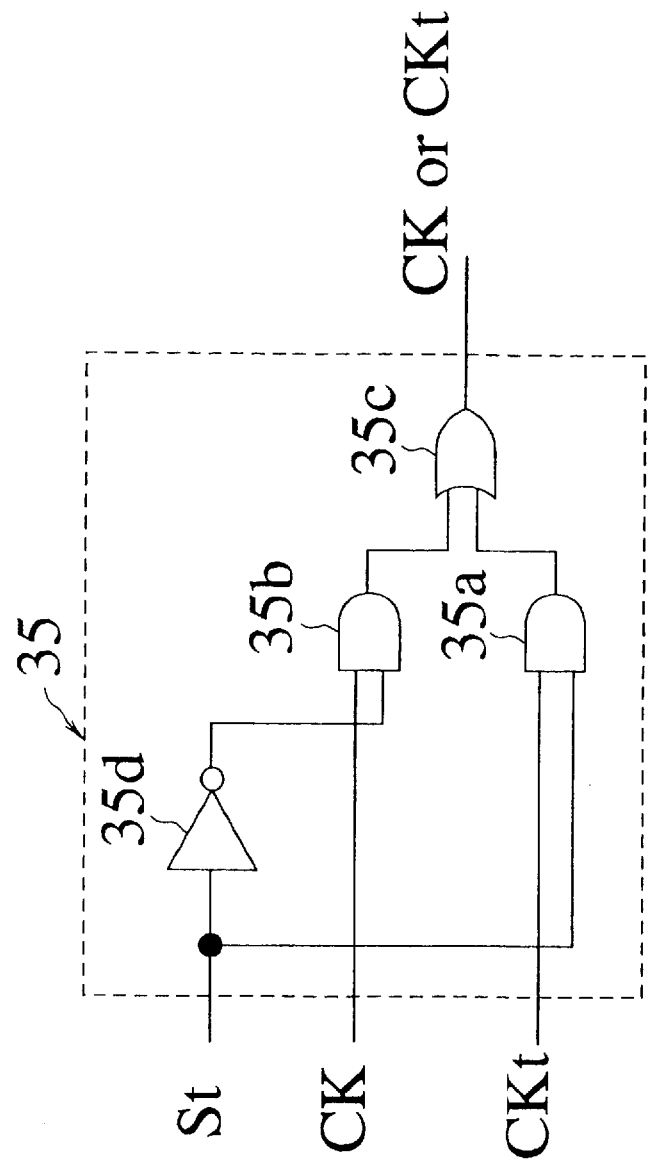
FIG. 7 shows a clock selecting circuit.

The clock selecting circuit 35 comprises known logic circuits. Referring to FIG. 7, the clock selecting circuit 35 is composed of a first 2-input AND circuit 35a, a second 2-input AND circuit 35b, a 2-input OR circuit 35c, and an inverter circuit 35d. The first 2-input AND circuit 35a receives the test mode signal St and the test clock signal CKt. The second 2-input AND circuit 35b receives the clock signal CK from the clock generating circuit 13 and the test mode signal St through the inverter circuit 35d. The respective outputs of the first and second AND circuits 35a and 35b are inputted into the 2-input OR circuit 35c. The output of the 2-input OR circuit 35c is the output of the clock selecting circuit 35 which is input to the ROW-system control circuit 15.

Figure 2:
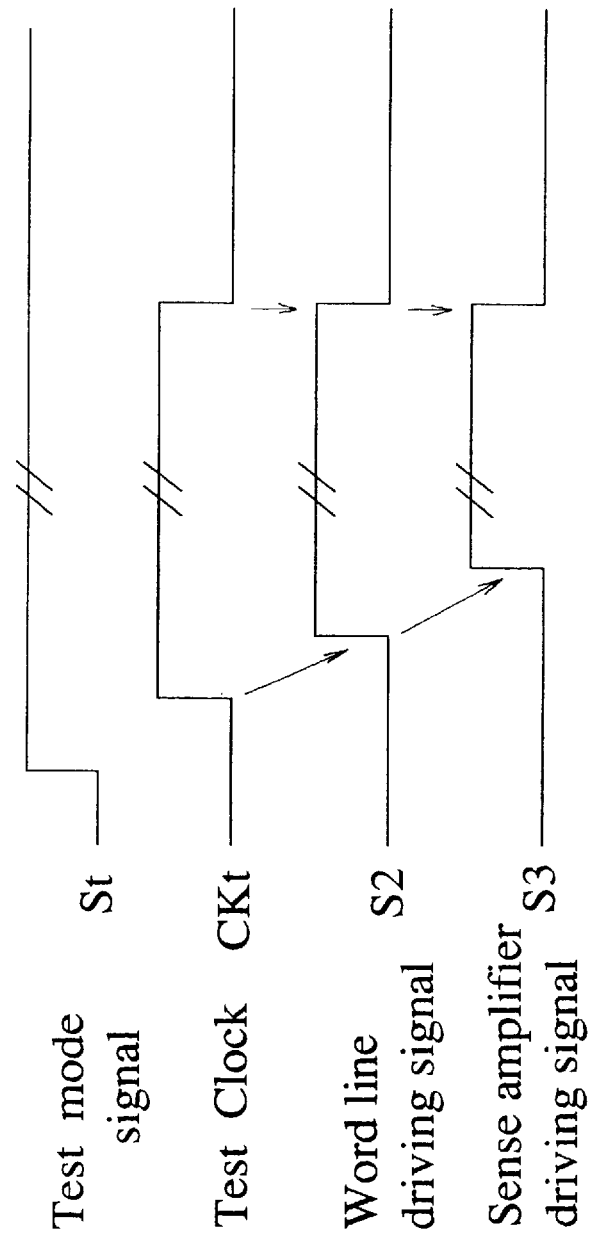
FIG. 2 is a timing chart showing operation in a test mode of the semiconductor memory device of FIG. 1.
Figure 12:
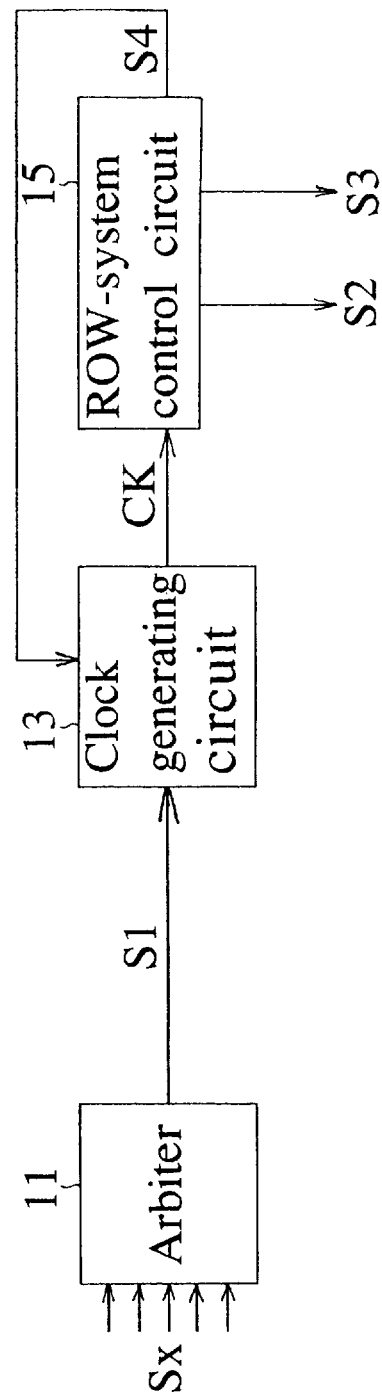
FIG. 12 is a block diagram for explaining an existing semiconductor memory device of the type which generates a clock signal.
Figure 13:
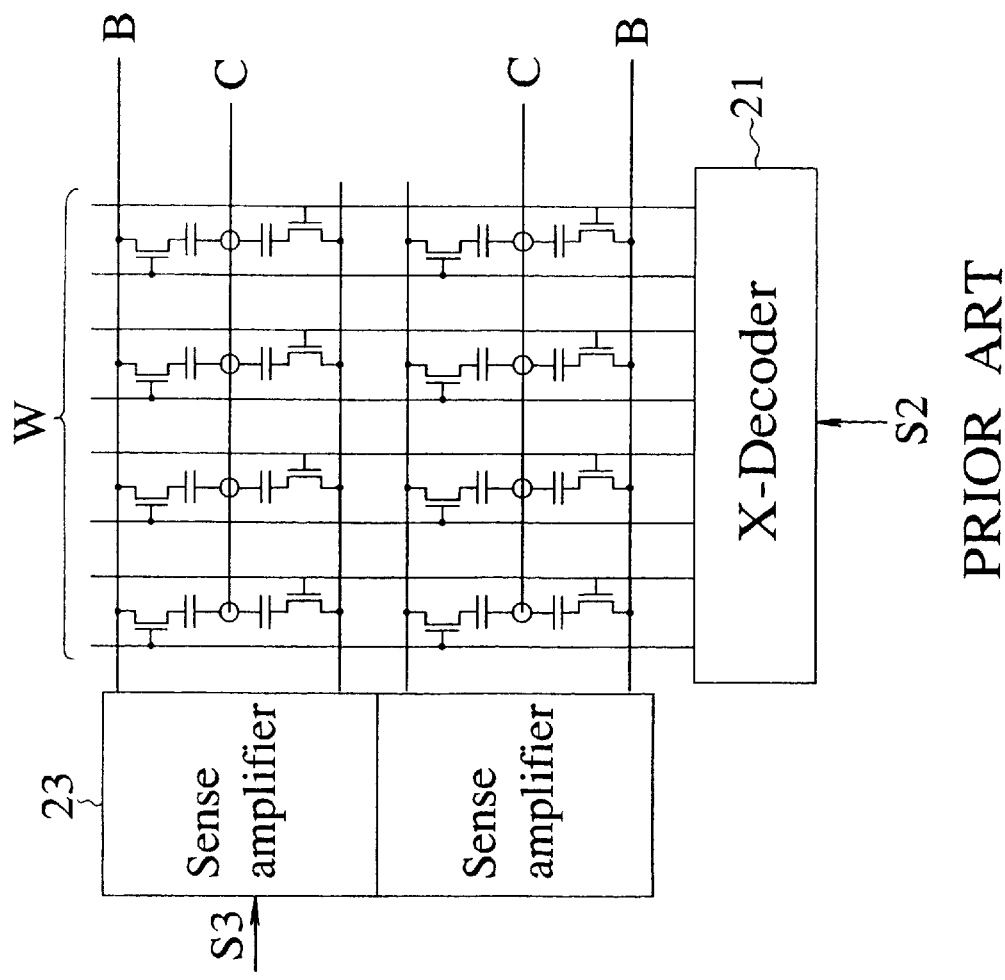
FIG. 13 is a schematic diagram showing the peripheral components of a memory cell group of a known semiconductor memory.
Figure 14:
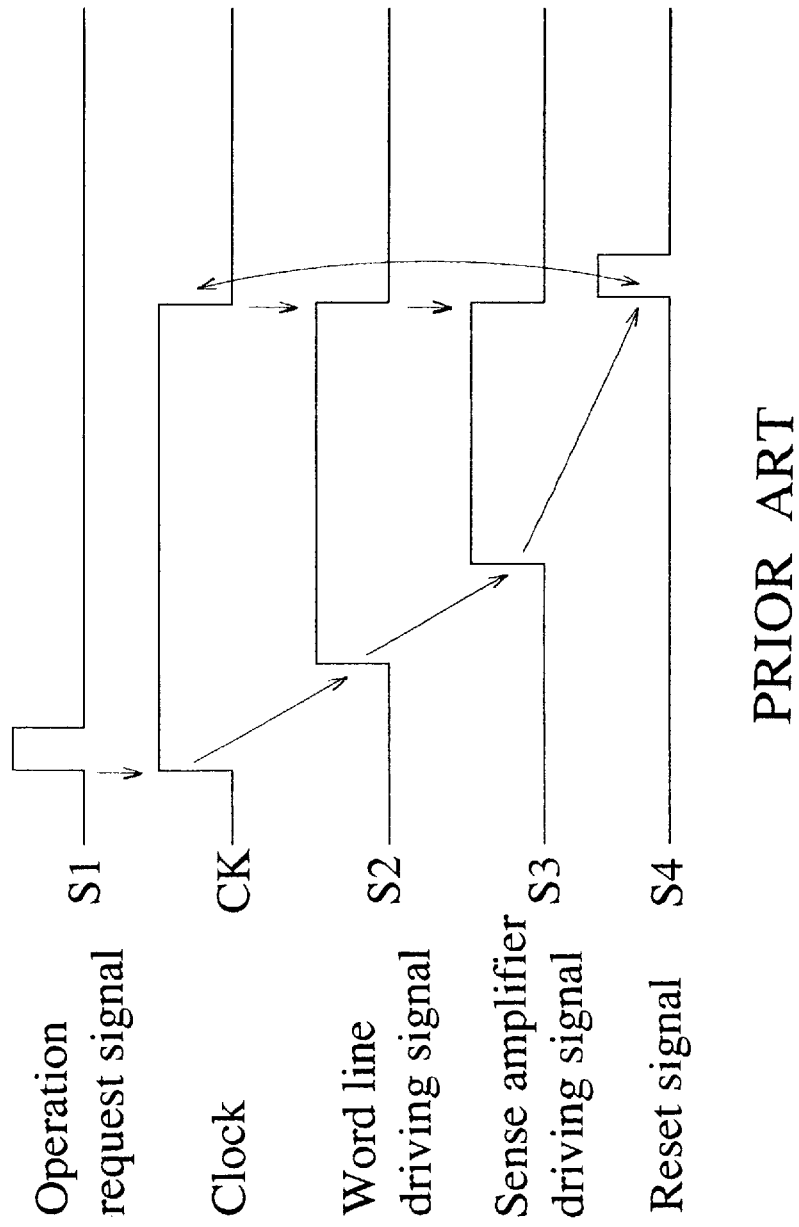
FIG. 14 is a diagram for explaining the operation of the semiconductor memory device of FIG. 12.

If the test mode signal St is in the "L" state, AND circuit 35b outputs the clock signal CK from the clock generating circuit 13 via the OR circuit 35c to the control circuit 15. In this mode of operation, the ordinary fundamental operation explained with reference to FIGS. 12 to 14 is performed. On the other hand, when the test mode signal St is placed in the "H" state, AND circuit 35a outputs the test clock signal CKt applied to terminal 33 via the OR circuit 35c to the control circuit 15. In this mode of operation, the output of the clock selecting circuit 35 is changed over to the test clock CKt, bringing the semiconductor memory device into a test state. The operation of this embodiment in the test state after the test mode signal St has been inputted is described hereinafter with reference to the timing chart of FIG. 2.

In the test state, the clock selecting circuit 35 outputs the test clock signal CKt to the ROW-system control circuit 15.

In response to the test clock signal CKt, the ROW-system control circuit 15 causes the semiconductor memory device to perform a fundamental operation. Specifically, the ROW-system control circuit 15 outputs driving signals S2 and S3 which activate a word line and render a sense amplifier active.

The ROW-system control circuit 15 also generates the reset signal S4 which is input to the clock generating circuit 13 in the same way as in an ordinary operation at a specified time after the test clock CKt has been generated. The clock generating circuit 13 stops generating the clock signal CK upon receipt of the reset signal S4. However, since the semiconductor memory device is in the test state, the clock generating circuit 13 and the ROW-system control circuit 15 are not connected with each other. Thus, even though the clock signal CK from the clock generating circuit 13 is no longer being generated, operation of the ROW-system control circuit 15 continues.

In the test state, the ROW-system control circuit 15 is not reset so long as the test clock CKt is not switched to the "L" level. Accordingly, the sense amplifier is kept in an active state. Therefore, if a short circuit has developed between a bit line and a cell plate, it is possible to monitor the short circuit until some change occurs in the level of the Vcc/2 terminal.

Thus, a long cycle test can be performed. Such a test is not limited to a test for a short circuit between a bit line and a cell plate. Various other tests can be performed for abnormal states if they are reflected in fundamental operations of the semiconductor memory device. This is also true of the embodiments of the invention to be described hereinafter. For example, a voltage raising circuit is often included in the semiconductor memory device to provide a voltage close to 2Vcc for use as a word line driving signal. A performance test on this voltage raising circuit to determine whether or not a raised voltage level is maintained in a long cycle test can also be performed.

Second Embodiment

Figure 3:
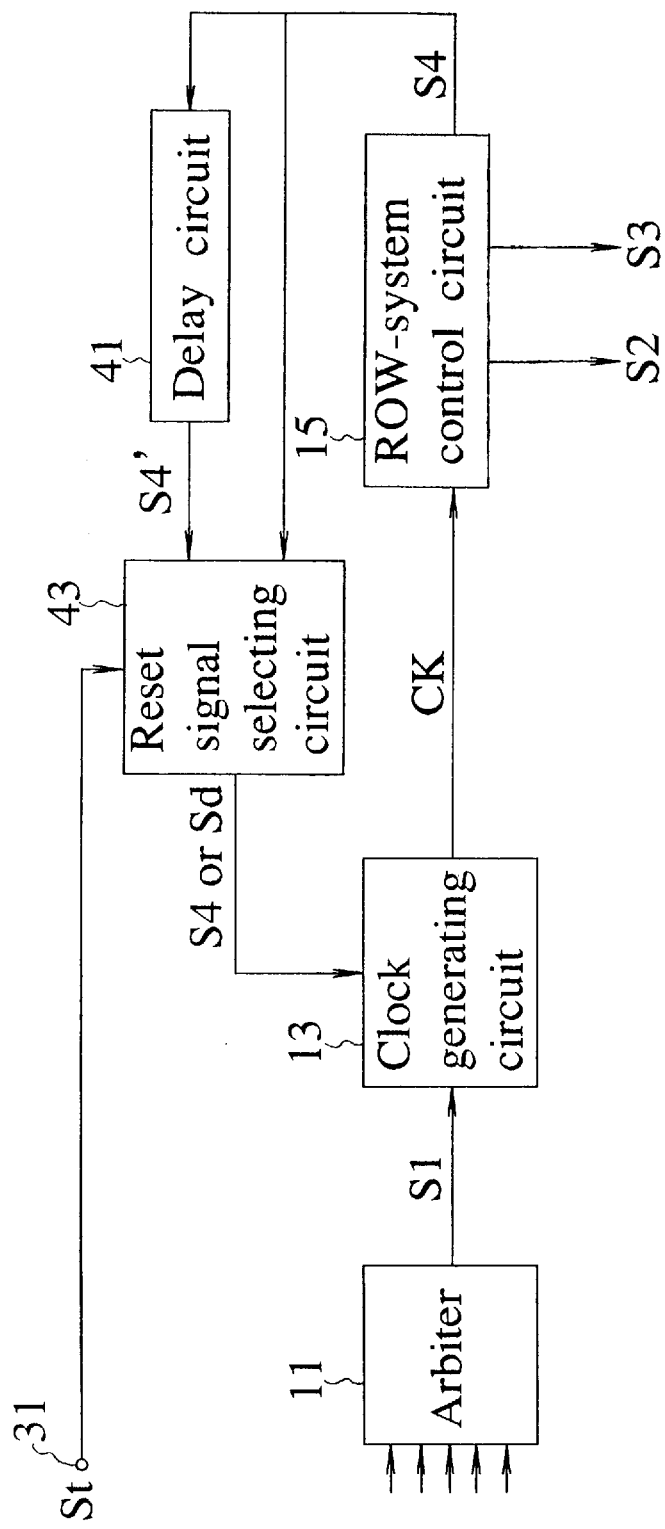
FIG. 3 is a block diagram showing a second embodiment of a semiconductor memory device of the invention.

FIG. 3 is a block diagram showing a second embodiment of the invention. Similar to the first embodiment, this semiconductor memory device is provided with an arbiter 11, a clock generating circuit 13, an ROW-system control circuit 15 and a terminal 31 for inputting the test mode signal St when performing a specified test. The second embodiment is also provided with a delay circuit 41 and a reset signal selecting circuit 43. The terminal 31, the reset signal S4, and the output of the delay circuit 41 are connected to the reset signal selecting circuit 43.

The input of the delay circuit 41 receives the reset signal S4 generated by the ROW-system control circuit 15. Delay circuit 41 provides a delay sufficient to extend the time required for the reset signal S4 to reach the clock generating circuit 13 so that the operating time during which a fundamental operation of the semiconductor memory device can be carried out for the purpose of conducting a test is longer than the operating time for a fundamental operation to be carried out in the ordinary use of the semiconductor memory device. Accordingly, if an abnormal state exists in the memory device, the operating time of the fundamental operation is extended.

Figure 11:
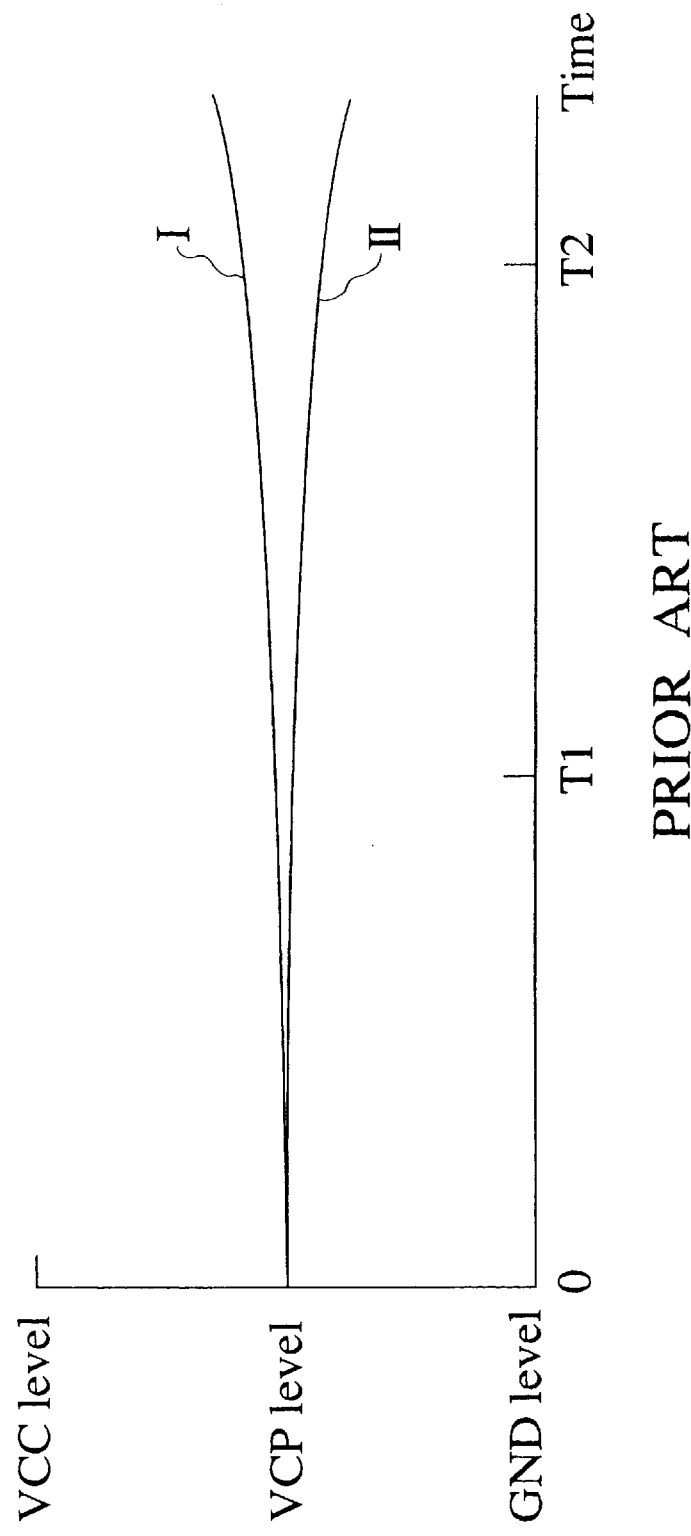
FIG. 11 is a graph for explaining the prior art and the present invention which shows changes in the voltage level of a cell plate when a bit line and a cell plate are short circuited.

For example, considering the example explained, in connection with FIG. 11, the delay provided by the delay circuit 41 is long enough to delay the reset signal S4 so that it reaches the clock generating circuit 13 on or after the time T2. The reset signal selecting circuit 43 outputs to the clock generating circuit 13 a reset signal Sd outputted from the delay circuit 41 when a test mode signal St has been inputted; otherwise it outputs to the clock generating circuit 13 the reset signal S4 outputted from the ROW-system control circuit 15.

Figure 8:
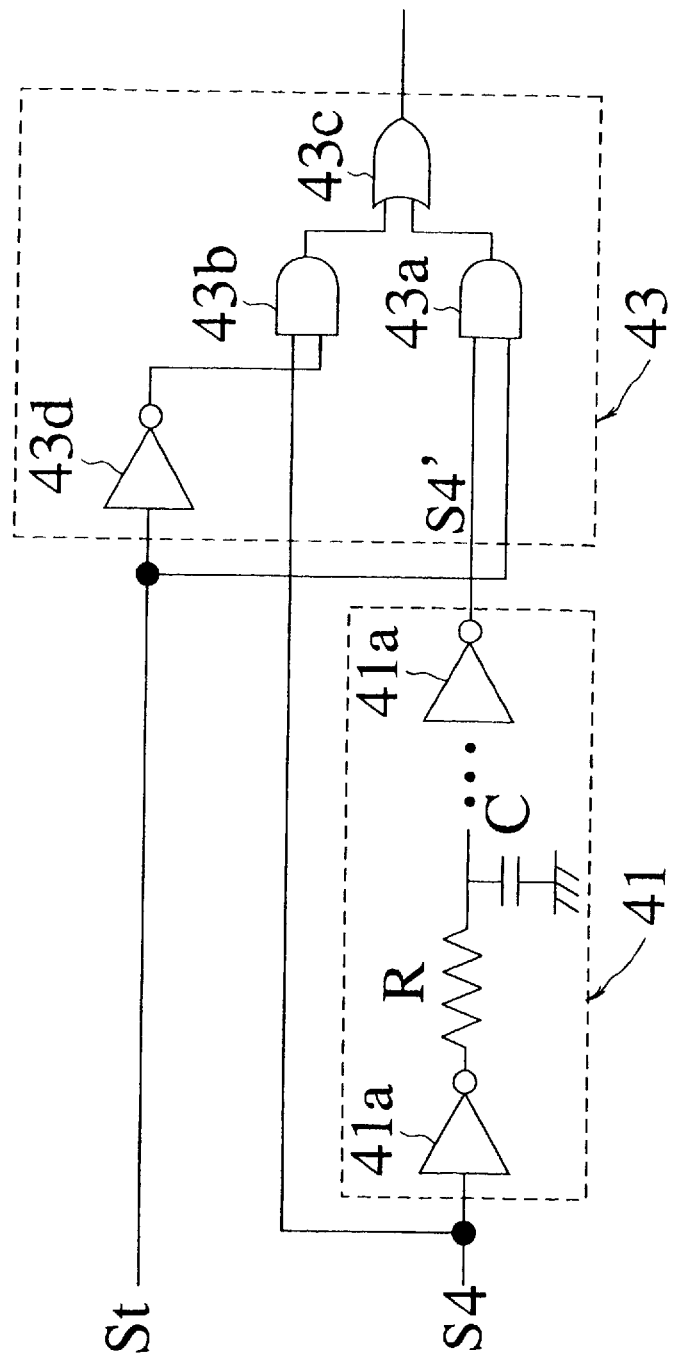
FIG. 8 shows a delay circuit and a reset signal selecting circuit.

The delay circuit 41 and reset signal selecting circuit 43 comprise known logic circuits. Referring to FIG. 8, the delay circuit 41 is a circuit comprising the number of delay devices needed to provide the desired amount of delay. Each of the delay devices comprises an inverter circuit 41a, a resistor R connected to the output side of the inverter, and a capacitor C connected between the output terminal of the resistor R and ground. The number of inverter stages is adjusted so that the input side and the output side of the delay circuit 41 have the same logic.

The reset signal selecting circuit 43 is a circuit comprising a first 2-input AND circuit 43a, a second 2-input AND circuit 43b, a 2-input OR circuit 43c, and an inverter circuit 43d. The first 2-input AND circuit 43a receives the delayed reset signal S4' through the delay circuit 41 and the test mode signal St. The second 2-input AND circuit 43b receives the test mode signal St through the inverter circuit 43d and the reset signal S4. The respective outputs of the first and second AND circuits 43a and 43b are inputted into the 2-input OR circuit 43c. The output of the 2-input OR circuit 43c is the output of the reset signal selecting circuit 43.

When the test mode signal St is in the "L" state, the semiconductor memory device performs an ordinary operation, that is, the fundamental operation explained with reference to FIGS. 12 to 14. Specifically, when the signal St is in the "L" state, the reset signal S4 generated by the ROW-system control circuit 15 is connected by AND circuit 43b and OR circuit 43c of the reset signal selecting circuit 43 to the clock generating circuit 13. On the other hand, when the test mode signal St is in the "H" state, the delayed reset signal S4' is connected by AND circuit 43a and OR circuit 43c of the reset signal selecting circuit 43 to the clock generating circuit 13, and the semiconductor memory device is brought into a test state.

Figure 4:
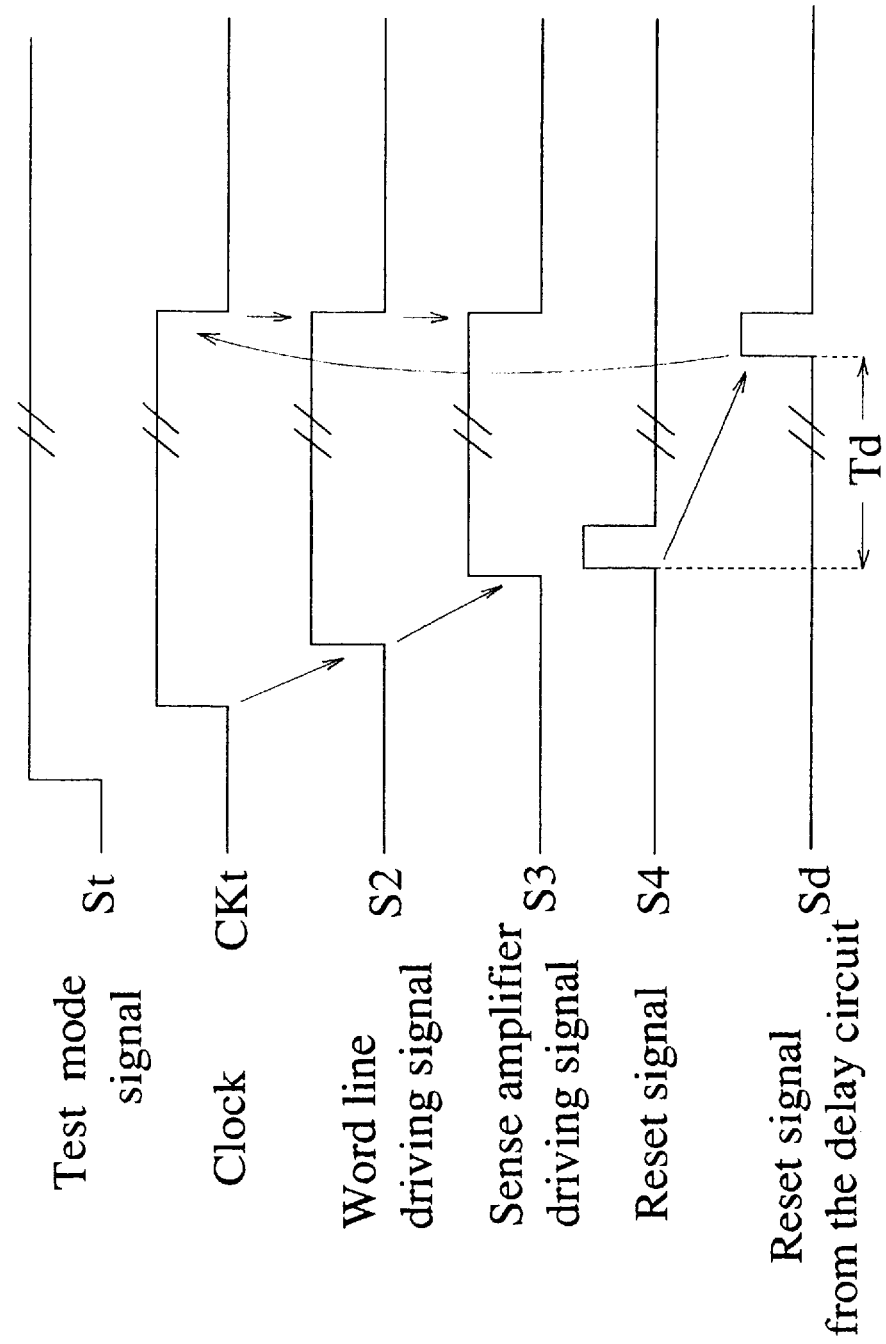
FIG. 4 is a timing chart showing operation in a test mode of the semiconductor memory device of FIG. 3.

Operation of this embodiment in the test state is described hereinafter with reference to the timing chart of FIG. 4. When the test mode signal is in the "L" state, the clock signal CK, the word line driving signal S2, the sense amplifier driving signal S3, and the reset signal S4 are generated at the same timing as explained in connection with the prior art system shown in FIG. 14. However, when the test mode signal is in the "H" state, the time when the reset signal Sd reaches the clock generating circuit 13 is delayed by a delay Td provided by the delay circuit 41. Since the time when the clock signal CK being generated by the clock generating circuit 13 should be stopped is delayed by the delay Td, the time until the ROW-system control circuit 15 is reset is extended. As a result, the operating time for a fundamental operation such as activating a word line, rendering a sense amplifier active, or the like is extended. Therefore, the sense amplifier is kept in an active state for a longer time than in ordinary use. Accordingly, if a short circuit has occurred between a bit line and a cell plate, it is possible to monitor the short circuit until some change occurs in the level of the Vcc/2 terminal. Thus, a long cycle test can be performed.

In the second embodiment, since the terminal 33 for inputting the test clock signal CKt required for the first embodiment is omitted, it is possible to significantly reduce the size of the chip and package.

Third Embodiment

In a semiconductor memory device, when a large number of memory cells are connected with a single word line or a bit line, it is difficult to drive each memory cell. Therefore, in a large capacity semiconductor memory device, the memory cell group is generally divided into plural blocks. The third embodiment of the invention comprises a semiconductor memory device in which a clock signal is generated inside the device and whose memory cell group is divided into plural blocks.

When a memory cell group of a semiconductor memory device is divided into plural blocks, it is necessary to perform a test on each of the blocks to determine whether or not there is a high resistance short circuit between a cell plate and a bit line. This test can be carried out by performing the above-mentioned long cycle test by activating an arbitrary single word line for one block. The reason is that, since all sense amplifiers inside one block can be brought into an active state at the same time, if a short circuit has occurred between a cell plate and any of the bit lines, the influence of the short circuit appears on the VCP level. Therefore, to shorten the test time, it is preferable to jump to the next block as soon as the test has been completed on a block by activating an arbitrary word line inside the block. However, since in a field memory, a line memory, and the like only serial access can be performed, it is necessary to increment an address counter inside the device to an address corresponding to each block to perform a test on each block. Therefore, in the first or second embodiment of the invention, a long cycle test must be performed on each of the addresses, which require a very large amount of test time. Accordingly, in the third embodiment, the arrangement shown in FIG. 5 is used in the case of a semiconductor memory device whose memory cell group is divided into plural blocks 1 to 4.

Figure 5:
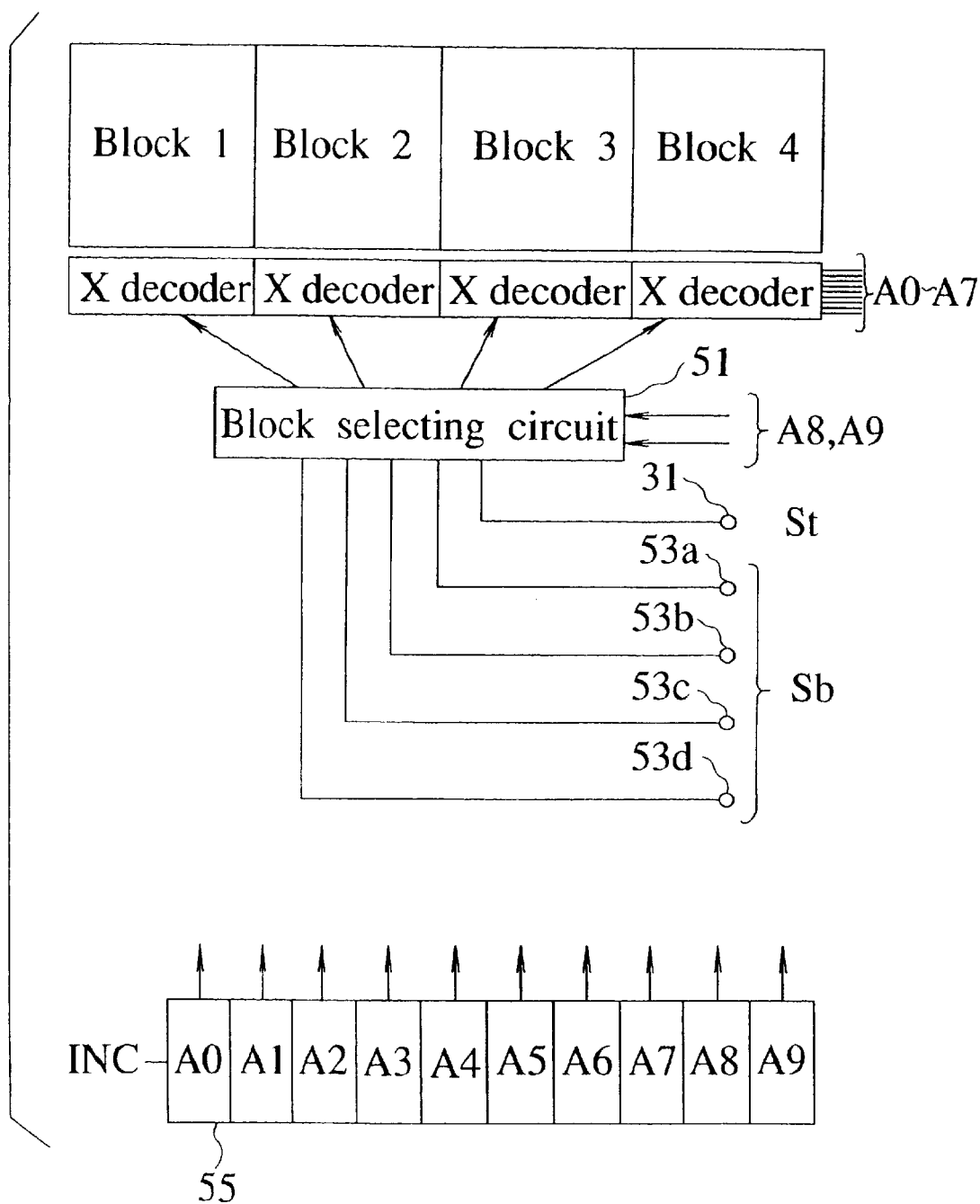
FIG. 5 is a block diagram showing a third embodiment of a semiconductor memory device of the invention.

In FIG. 5, each of the plurality of blocks 1 to 4 is provided with an X decoder for selecting a word line. Further provided is a block selecting circuit 51, terminals 53a to 53d, a first terminal 31 for inputting a test mode signal St, and an ROW address counter 55 to output address data for selecting a word line. The ROW address counter 55 outputs address data A0 to A9 for selecting a word line of a memory cell group by performing a counting operation according to an increment signal INC. In this example, address data A8 and A9 are specified as block selecting bits which are inputted into the block selecting circuit 51. The residual data A0 to A7 are inputted respectively into the X decoders for the blocks 1 to 4.

In the ordinary operation of the semiconductor memory device, the word lines of a memory cell group are selected one after another from block 1 to block 4 according to address data A0 to A9. On the other hand, in the test mode, only address data A0 to A7 are used, as described hereinafter. The terminals 53a to 53d are connected to the block selecting circuit 51 separately from the address data A8 and A9. These terminals 53a to 53d are terminals for inputting a block selecting signal for selecting an arbitrary block out of the plural blocks 1 to 4. The first terminal 31 for inputting a test mode signal is also connected to the block selecting circuit 51. The block selecting circuit 51 validates the block selecting signals from terminals 53a to 53d when a test mode signal St has been inputted, and otherwise validates signals of the block specifying bits A8 and A9 out of the address data outputted from the ROW address counter 55. The block selecting circuit 51 can be obtained by combining known logic circuits.

Figure 9:
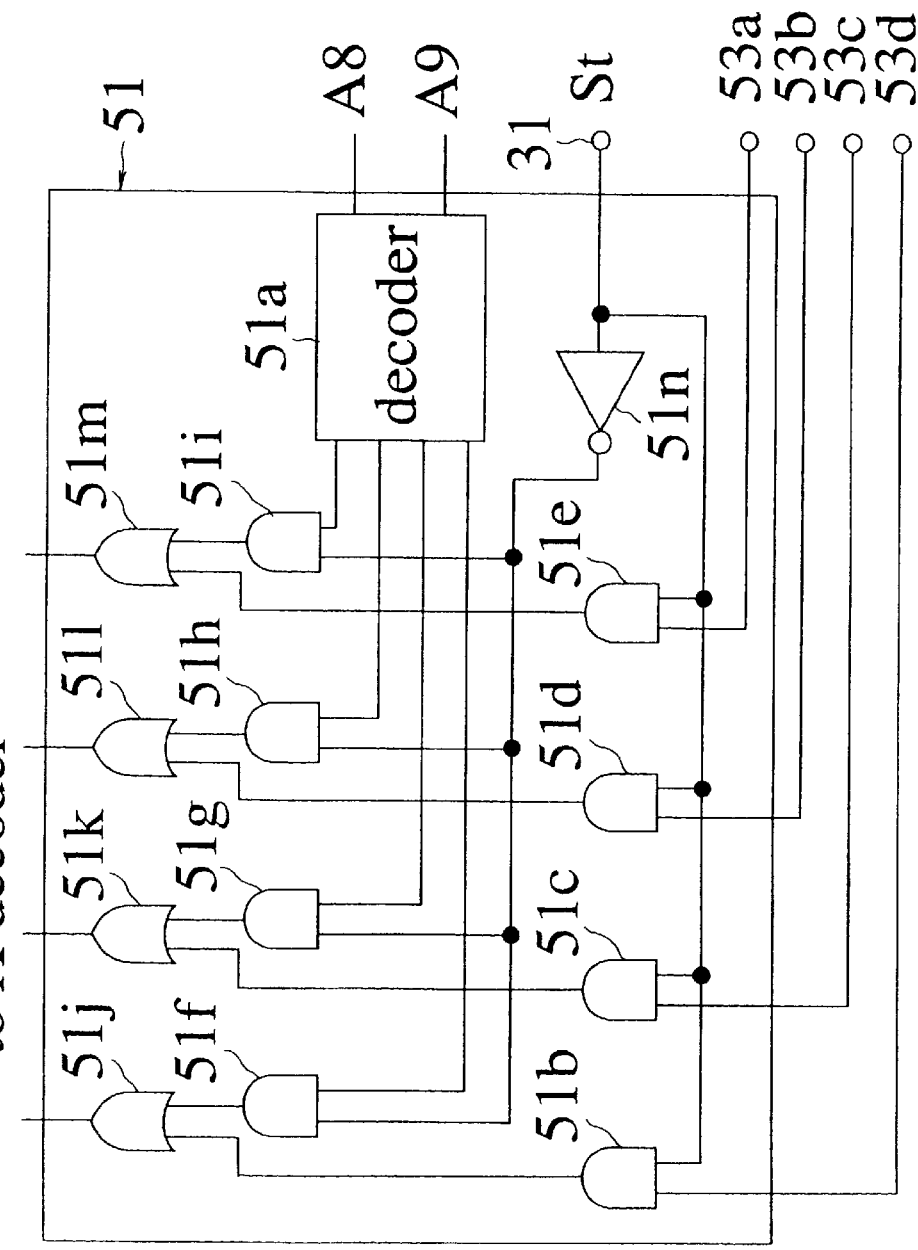
FIG. 9 shows a block selecting circuit.

An example of a block selecting circuit is shown in FIG. 9. In this example, the data inputted from the ROW address counter 55 are the two bits A8 and A9, and a signal input system is provided in which terminals 53a to 53d has four bits. The block selecting circuit 51 in this example is a circuit which has as input data the block selecting bits A8 and A9 outputted from the ROW address counter 55, and which comprises a decoder 51a having four outputs, first to eighth 2-input AND circuits 51b to 51i, first to fourth 2-input OR circuits 51j to 51m, and an inverter circuit 51n. The first terminal 31 for inputting the test mode signal St is connected to one input side of each of the first to fourth 2-input AND circuits 51b to 51e. Each of the terminals 53a to 53d is respectively connected to the other input side of each of the first to fourth 2-input AND circuits 51b to 51e without duplication. The first terminal 31 is connected through an inverter circuit 51n to one input side of each of the fifth to eighth 2-input AND circuits 51f to 51i. Each of the four outputs of the decoder 51a is respectively connected to the other input side of each of the fifth to eighth 2-input AND circuits 51f to 51i without duplication. Each of the outputs of the first to fourth 2-input AND circuits 51b to 51e is respectively connected to one input side of each of the first to fourth 2-input OR circuits 51j to 51m without duplication. Each of the outputs of the fifth to eighth 2-input AND circuits 51f to 51i is respectively connected to the other input side of each of the first to fourth 2-input OR circuits 51j to 51m without duplication. The outputs of the first to fourth 2-input OR circuits 51j to 51m are, respectively, outputs of the block selecting circuit 51.

In the third embodiment, when carrying out a specified test, a test mode signal St in the "H" state is inputted to the first terminal 31, and block selecting signals are inputted one after another through terminals 53a to 53d. Then, selection of either of blocks 1 to 4 is performed by input signals from the terminals 53a to 53d. Namely, a block to be specified can be changed without incrementing one by one the ROW address counter 55. Selection of a word line in a selected block is performed by address data A0 to A7 out of address data A0 to A9. Then, a long cycle test is performed. Since this can be performed by either of the first and second embodiments, a further explanation is omitted.

On the other hand, when the memory device is not in the test mode, an ordinary serial access is performed by means of data A0 to A9 from the ROW address counter 55. Although this embodiment has four terminals for inputting block selecting signals from an external source, this is only because an example was considered in which the blocks 1 to 4 illustrated in FIG. 5 were selected on a one-to-one basis. The invention is not limited to this specific embodiment.

The third embodiment can also specify a block to be tested from outside the semiconductor memory device in which a clock is generated and whose memory cell group is divided into plural blocks. Accordingly, since it is not necessary to select all addresses, the test time can be shortened.

Fourth Embodiment

Figure 6:
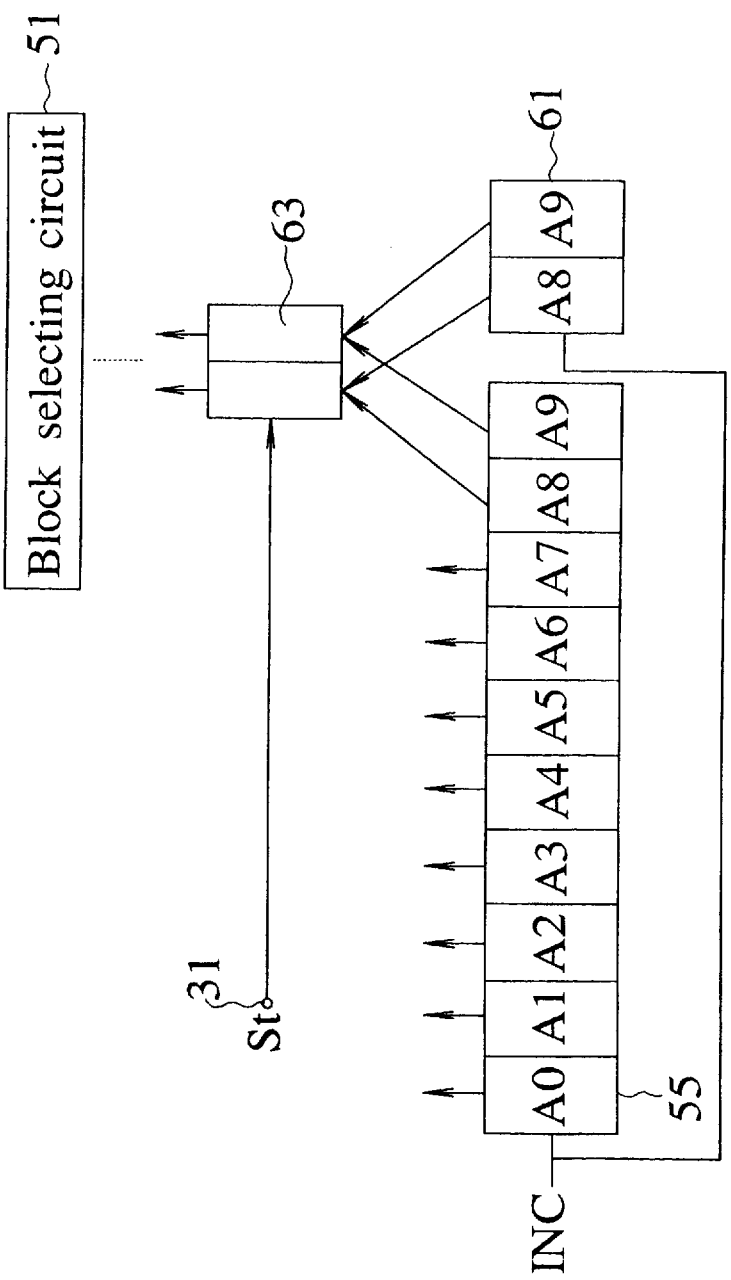
FIG. 6 is a block diagram showing a fourth embodiment of a semiconductor memory device of the invention.

The third embodiment makes it possible to perform a test on each block by providing terminals for inputting block selecting signals from a source external to the semiconductor memory device. Referring to FIG. 6, the fourth embodiment of the invention is provided with a first terminal 31 for inputting the test mode signal in the same way as in the first to third embodiments. The memory device is also provided with an ROW address counter 55, a block selecting circuit 51, a block selecting address counter 61, and a counter selecting circuit 63.

The block selecting circuit 51 may comprise only a decoder 51a (See FIG. 9) if it is to be used with a memory cell group of FIG. 13. The block selecting address counter 61 is a counter which is driven by an increment signal INC inputted into the ROW address counter 55 provided within the semi-conductor memory device. The counter selecting circuit 63 validates the operation of the block selecting address counter 61 when the test mode signal St has been inputted, and otherwise validates the operation of the address counter 55. In detail, the counter selecting circuit 63 validates the output of the block selecting address counter 61 when a test mode signal St has been inputted, and otherwise validates the output of block specifying bits (A8 and A9 in FIG. 6) in the ROW address counter 55.

Figure 10:
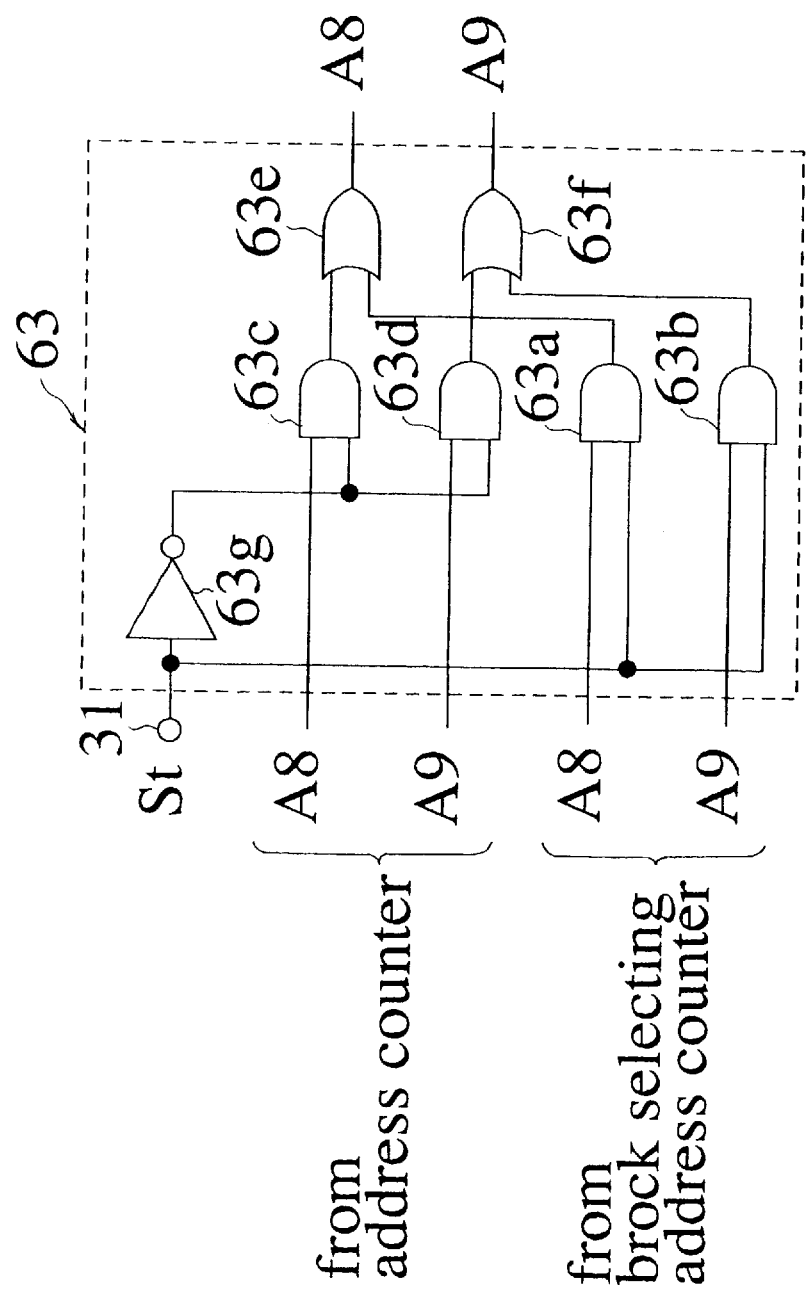
FIG. 10 shows a counter selecting circuit.

The counter selecting circuit 63, an example of which is shown in FIG. 10, can comprise a circuit obtained by combining known logic circuits. The counter selecting circuit 63 in this example is a circuit composed of first to fourth 2-input AND circuits 63a to 63d, first and second 2-input OR circuits 63e and 63f, and an inverter circuit 63g. The first terminal 31 for inputting the test mode signal St is connected to one input side of each of the first and second 2-input AND circuits 63a and 63b, and each of the outputs A8 and A9 of the block selecting address counter 61 is connected respectively to the other input side of each of the first and second 2-input AND circuits 63a and 63b without duplication. The first terminal 31 is connected through the inverter circuit 63g to one input side of each of the third and fourth 2-input AND circuits 63c and 63d, and each of the block specifying bits A8 and A9 output from the ROW address counter 55 is connected respectively to the other input side of each of the third and fourth 2-input AND circuits 63c and 63d without duplication. The respective outputs of the 2-input AND circuits 63c and 63a, having as input the respective outputs A8 of the counters 55 and 61, are inputted to the first 2-input OR circuit 63e. The respective outputs of the 2-input AND circuits 63d and 63b, having as input the respective outputs A9 of the counters 55 and 61, are inputted into the second 2-input OR circuit 63f. The outputs of the first and second 2-input OR circuit 63e and 63f are outputs of the counter selecting circuit 63. The outputs of the counter selecting circuit 63 are inputted to the data A8 and A9 inputting terminals of the block selecting circuit 51.

In the semiconductor memory device of the fourth embodiment, when a test mode signal St is inputted, the counter selecting circuit 63 validates an operation of the block selecting address counter 61. When an increment signal is inputted in a state where a test mode signal St has been inputted, the data in the block selecting address counter 61 is updated one by one for each increment operation. Namely, bits A8 and A9 corresponding to block selecting bits in the address data are updated in the counter 61 side according to increment signals. In a test mode, therefore, each time an increment signal is received, a specified block is changed one by one. Additionally, the above-mentioned long cycle test is performed on a specified block by activating a word line selected by address data A0 to A7 out of address data A0 to A9.

For better understanding, a test using the circuit of FIG. 6 is described. The first word line in the first block is selected by the first increment signal, and the long cycle test explained in connection with the first or second embodiment is performed. The second word line in the second block is selected by the second increment signal, and so on; and the fourth word line in the fourth block is selected by the fourth increment signal. In this way, a long cycle test is performed, and when this has been finished the test ends. In the test mode, therefore, the test can be sequentially performed on the respective blocks. In the fourth embodiment, since the terminals 53a to 53d provided in the third embodiment for inputting block selecting signals from an external source are unnecessary, it is possible to greatly reduce the size of the chip and package. In this example, a specific sequence for accessing the plural blocks has been explained. However, the order in which the plural blocks are selected can be made in another preferable order.

Summarizing, a method is disclosed for testing a semiconductor memory device comprising a clock generating circuit for generating a clock signal in response to the receipt of a request signal and stopping the clock in response to a reset signal outputted from a control circuit which causes the semiconductor memory device to perform its fundamental operation while the clock signal is being generated and outputting the reset signal at a specified time after the clock signal has been generated; first and second terminals; and a clock selecting circuit. When carrying out a specified test, a test mode signal is inputted to the first terminal and a test clock signal is inputted to the second terminal. The test clock signal extends the operating time of the fundamental operation, in comparison with the ordinary operating time, so that, if an abnormal state exists in the semiconductor memory device it can be detected.

According to another method for testing a semiconductor memory device, a delay circuit is provided which permits omission of the second terminal and the clock selecting circuit. When carrying out a specified test, the test mode signal is inputted to the first terminal.

According to these methods, a long cycle fundamental operation can be performed. Thus, since a long cycle test can be performed on a semiconductor memory device of the type which generates a clock signal internally, a test for a high resistance short circuit between a bit line and a cell plate can be performed.

What is claimed is:

1. A method for performing a specified test on a semiconductor memory device having a clock generating circuit and a control circuit, said clock generating circuit generating a clock signal in response to an operation request signal and said control circuit generating a reset signal for stopping generation of said clock signal after a predetermined period of time, said control circuit further generating at least one operation control signal for performing a fundamental operation of said memory device in response to said clock signal, said method comprising the steps of:

inputting a test mode signal to the semiconductor memory device to initiate the specified test;

delaying generation of the reset signal for a period of time exceeding the predetermined period of time;

carrying out the specified test while said test mode signal is being input; and ending the specified test by terminating input of said test mode signal.

2. A method for performing a specified test on a semiconductor memory device having a clock generating circuit and a control circuit, said clock generating circuit generating a clock signal in response to an operation request signal and said control circuit generating a reset signal for stopping generation of said clock signal after a predetermined period of time, said control circuit further generating at least one operation control signal for performing a fundamental operation of said memory device in response to said clock signal, said method comprising the steps of:

inputting a test mode signal and a test clock signal to a clock selecting circuit, said clock selecting circuit in response to said test mode signal replacing said clock signal with said test clock signal as an input to said control circuit;

carrying out said specified test by continuing to input said test mode signal to said clock selecting circuit and said test clock signal to said control circuit, said control circuit generating at least one operation control signal for performing a fundamental operation of said semiconductor memory device for a period of time exceeding the predetermined time; and ending the specified test by terminating input of said test mode signal to said clock selecting circuit.

3. A method for testing a semiconductor device as claimed in claim 2 wherein a frequency of said test clock signal is lower than a frequency of said clock signal.

4. A method for performing a specified test on a semiconductor memory device having a clock generating circuit and a control circuit, said clock generating circuit generating a clock signal in response to an operation request signal and said control circuit generating a reset signal for stopping generation of said clock signal after a predetermined period of time, said control circuit further generating at least one operation control signal for performing a fundamental operation of said memory device in response to said clock signal, said method comprising the steps of:

inputting the reset signal outputted from the control circuit to a delay circuit to generate a delayed reset signal;

inputting a test mode signal, the reset signal and the delayed reset signal to a reset signal selecting circuit, said reset signal selecting circuit replacing said reset signal with said delayed reset signal when receiving said test mode signal;

inputting said delayed reset signal to the clock generating circuit to stop said clock signal after a period of time exceeding the predetermined time;

carrying out the specified test by continuing to input said test mode signal to said reset signal selecting circuit, said control circuit generating at least one operation control signal for performing a fundamental operation of said semiconductor memory device for a period of time exceeding the predetermined time; and terminating said specified test by removing said test mode signal from said reset signal selecting circuit.

5. A method for testing a semiconductor memory device as claimed in claim 1 which comprises the further steps of:

dividing said semiconductor memory device into a plurality of memory blocks;

inputting said test mode signal to a block selecting circuit;

inputting block selection signals to said block selecting circuit to select memory blocks to be tested; and performing said specified test sequentially on said plurality of memory blocks during inputting of said test mode signal.

6. A method for testing a semiconductor memory device as claimed in claim 2 which comprises the further steps of:

dividing said semiconductor memory device into a plurality of memory blocks;

inputting said test mode signal to a block selecting circuit;

inputting block selection signals to said block selecting circuit to select memory blocks to be tested; and performing said specified test sequentially on said plurality of memory blocks during inputting of said test mode signal.

7. A method for testing a semiconductor memory device as claimed in claim 4 which comprises the further steps of:

dividing said semiconductor memory device into a plurality of memory blocks;

inputting said test mode signal to a block selecting circuit;

inputting block selection signals to said block selecting circuit to select memory blocks to be tested; and performing said specified test sequentially on said plurality of memory blocks during inputting of said test mode signal.

8. A method for testing a semiconductor memory device as claimed in claim 1 wherein said memory device has a bit line and a cell plate, and wherein said specified test is a test for a short circuit between a bit line and a cell plate.

9. A method for testing a semiconductor memory device as claimed in claim 2 wherein said memory device has a bit line and a cell plate, and wherein said specified test is a test for a short circuit between a bit line and a cell plate.

10. A method for testing a semiconductor memory device as claimed in claim 4 wherein said memory device has a bit line and a cell plate, and wherein said specified test is a test for a short circuit between a bit line and a cell plate.

11. A semiconductor memory device comprising:

a clock generating circuit for generating a clock signal in response to an operation request signal, said clock signal having a given frequency;

a control circuit for generating at least one operation control signal for performing a fundamental operation of said memory device in response to said clock signal, said control circuit further generating a reset signal output to said clock generating circuit for stopping generation of said clock signal after a predetermined interval of time; and a clock selecting circuit, interposed between said clock generating circuit and said control circuit, for receiving a test mode signal and a test clock signal, said test clock signal having a frequency which is lower than the frequency of the clock signal, the clock selecting circuit coupling said clock signal to said control circuit when said test mode signal is not being received by said clock selecting circuit and coupling said test clock signal to said control circuit when said test mode signal is being received by said clock selecting circuit.

12. A semiconductor memory device comprising:

a clock generating circuit for generating a clock signal in response to an operation request signal;

a control circuit for generating a reset signal and at least one operation control signal for performing a fundamental operation of said memory device in response to said clock signal during a predetermined period of time;

a delay circuit receiving said reset signal and generating a delayed reset signal; and a reset signal selecting circuit connected to said clock generating circuit for receiving a test mode signal, the reset signal and the delayed reset signal, said reset signal being coupled to said clock generating circuit when said test mode signal is not being received by said reset signal selecting circuit, and said delayed reset signal being coupled to said clock generating circuit when said test mode signal is being received by said reset signal selecting circuit.

13. A semiconductor memory device as claimed in claim 11 which includes a memory cell group divided into a plurality of blocks, and which further comprises terminals for inputting block signals to said memory device for selecting an arbitrary block out of said plurality of blocks provided on a plural block selecting circuit located within said semiconductor memory device.

14. A semiconductor memory device as claimed in claim 12 which includes a memory cell group divided into a plurality of blocks, and which further comprises terminals for inputting block signals to said memory device for selecting an arbitrary block out of said plurality of blocks provided on a plural block selecting circuit located within said semiconductor memory device.

15. A semiconductor memory device as claimed in claim 11 which includes a memory cell group divided into a plurality of blocks, and which further comprises a block selecting address counter driven by an increment signal inputted into an address counter located within said semiconductor memory device; and a counter selecting circuit which validates operation of said block selecting address counter when said test mode signal has been inputted and validates operation of said address counter.

16. A semiconductor memory device as claimed in claim 12 which includes a memory cell group divided into a plurality of blocks, and which further comprises a block selecting address counter driven by an increment signal inputted into an address counter located within said semiconductor memory device; and a counter selecting circuit which validates operation of said block selecting address counter when said test mode signal has been inputted and validates operation of said address counter.

17. A semiconductor memory device as claimed claim 11 wherein said semiconductor memory device is a serial-access memory.

18. A semiconductor memory device as defined in claim 17 wherein said serial-access memory is a field memory or a line memory.

* * * * *